US011333684B1

(12) United States Patent
Hefelfinger

(10) Patent No.: US 11,333,684 B1
(45) Date of Patent: May 17, 2022

(54) CLAMP SENSOR SYSTEMS AND METHODS

(71) Applicant: Sensorlink Corporation, Ferndale, WA (US)

(72) Inventor: Kelly R. Hefelfinger, Vancouver (CA)

(73) Assignee: SENSORLINK CORPORATION, Ferndale, WA (US)

( * ) Notice: Subject to any disclaimer, the term of this patent is extended or adjusted under 35 U.S.C. 154(b) by 0 days.

(21) Appl. No.: 16/836,391

(22) Filed: Mar. 31, 2020

(51) Int. Cl.
*G01R 15/14* (2006.01)
*H01R 4/2408* (2018.01)
*H01R 4/2406* (2018.01)

(52) U.S. Cl.
CPC ........... *G01R 15/14* (2013.01); *H01R 4/2406* (2018.01); *H01R 4/2408* (2013.01)

(58) Field of Classification Search
CPC .... H02J 7/0031; H02J 7/0044; H01R 13/453; H01R 13/5219; H01R 13/5224; H01R 35/00; H01R 39/08; H01R 4/28; H01R 4/2406; H01R 4/2408; H02G 1/02; H02G 1/04; H02G 7/205; G01K 13/00; G01R 15/186; G01R 19/0084; G01R 19/0092; G01R 1/20; G01R 1/22; G01R 31/08; G01R 31/086; G01R 31/40; G01R 33/0094; G01R 33/072; G01R 15/14; F16B 2/065; F16B 2/12; F16B 21/065
See application file for complete search history.

(56) References Cited

U.S. PATENT DOCUMENTS

| | | | | |
|---|---|---|---|---|
| 4,799,005 A | * | 1/1989 | Fernandes | H02J 13/00002 324/127 |
| 6,744,255 B1 | * | 6/2004 | Steinbrecher | H01R 4/66 324/511 |
| 7,557,563 B2 | * | 7/2009 | Gunn | G01R 15/183 324/117 H |
| 10,228,001 B2 | * | 3/2019 | Chaput | F16B 2/10 |
| 10,570,937 B2 | * | 2/2020 | Hefelfinger | H01R 4/2483 |

* cited by examiner

*Primary Examiner* — Vinh P Nguyen
(74) *Attorney, Agent, or Firm* — Schacht Law Office, Inc.; Michael R. Schacht

(57) ABSTRACT

A cable clamp system comprises a base assembly defining a base notch defining a notch axis and a carriage assembly defining a drive axis. The drive axis is substantially orthogonal to the notch axis.

18 Claims, 9 Drawing Sheets

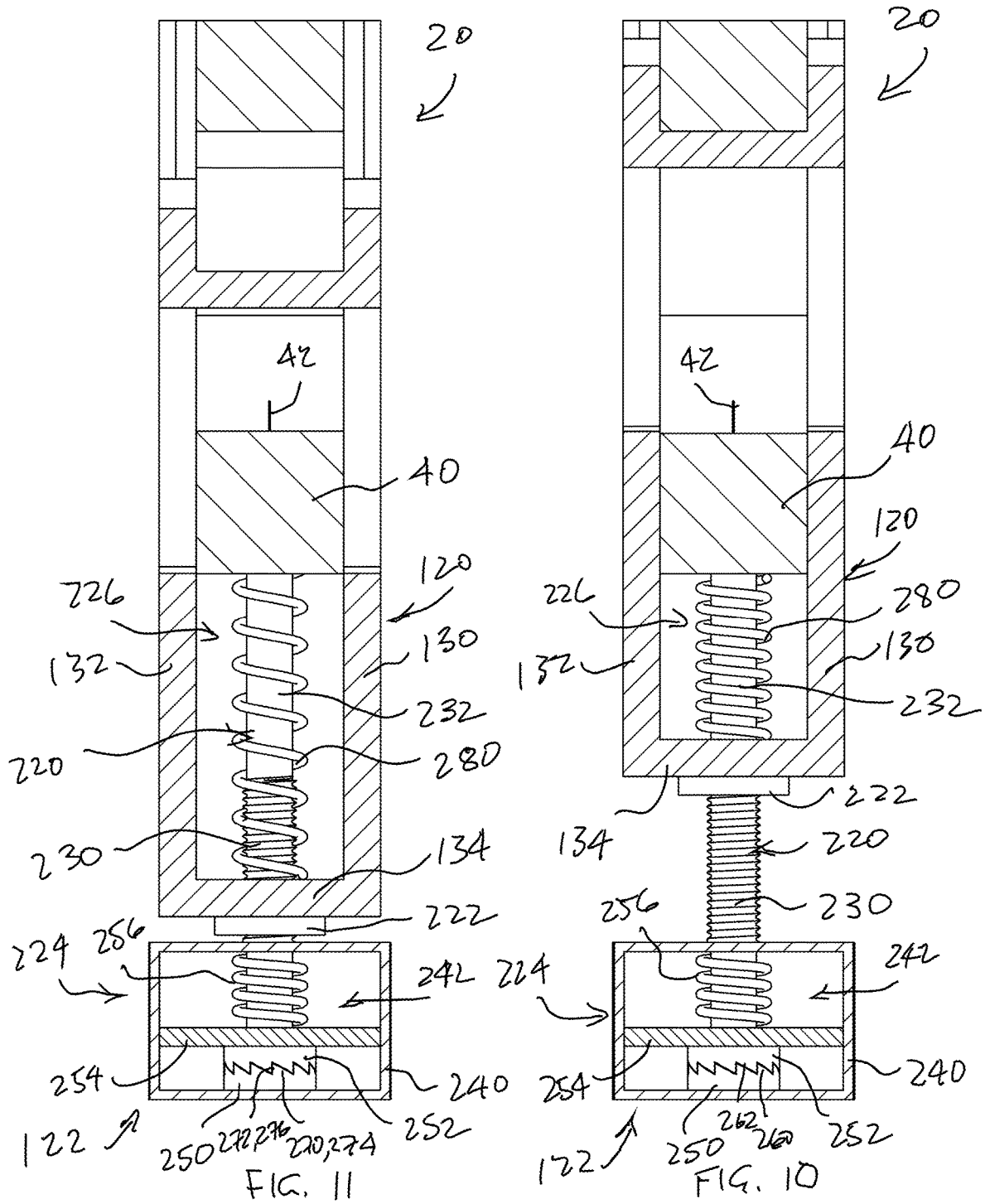

US 11,333,684 B1

CLAMP SENSOR SYSTEMS AND METHODS

TECHNICAL FIELD

The present invention relates to energy measurement systems and methods and, in particular, to systems and methods that facilitate the measurement of parameters and recording of data associated with power distribution systems.

BACKGROUND

Utility companies operate power distribution systems formed by networks of power distribution equipment connected by power lines. The power distribution equipment and power lines are often located in remote locations. Remote sensing systems and methods are used to sense parameters of the power distribution equipment and power lines so that the operation of the power distribution system may be monitored and optimized.

One type of remote sensing system employs a clamp to secure sensing equipment relative to a cable. The clamp secures the sensing equipment in place on the cable to allow the sensing equipment to measure operating parameters such as voltage and current associated with the cable.

The need exists for improved clamp systems and methods for securing sensor equipment relative to a cable.

SUMMARY

The present invention may be embodied as a cable clamp system comprising a base assembly defining a base notch defining a notch axis and a carriage assembly defining a drive axis. The drive axis is substantially orthogonal to the notch axis.

The present invention may also be embodied as a cable clamp system comprising a base assembly defining a base notch defining a notch axis, a carriage assembly defining a drive axis, a guide system for guiding the carriage assembly for movement along the drive axis, and a drive system for displacing the carriage assembly along the drive axis between an open position and a closed position. The drive axis is substantially orthogonal to the notch axis.

The present invention may also be embodied as a method of engaging a cable clamp system with a cable comprising the following steps. A base assembly defining a base notch defining a notch axis is provided. A carriage assembly is supported relative to the base assembly such that the carriage assembly moves relative to the base assembly along a drive axis, where the drive axis is substantially orthogonal to the notch axis. With the carriage assembly in an open position relative to the base assembly, the cable is arranged within the base notch. With the cable arranged within the base notch, the carriage assembly is displaced along the drive axis from the open position to a closed position.

DESCRIPTION OF THE DRAWINGS

FIG. 10 is section view taken along lines 10-10 in FIG. 2;

FIG. 11 is section view similar to FIG. 10 but depicting the carriage assembly in the closed position;

DETAILED DESCRIPTION

Figure 1:
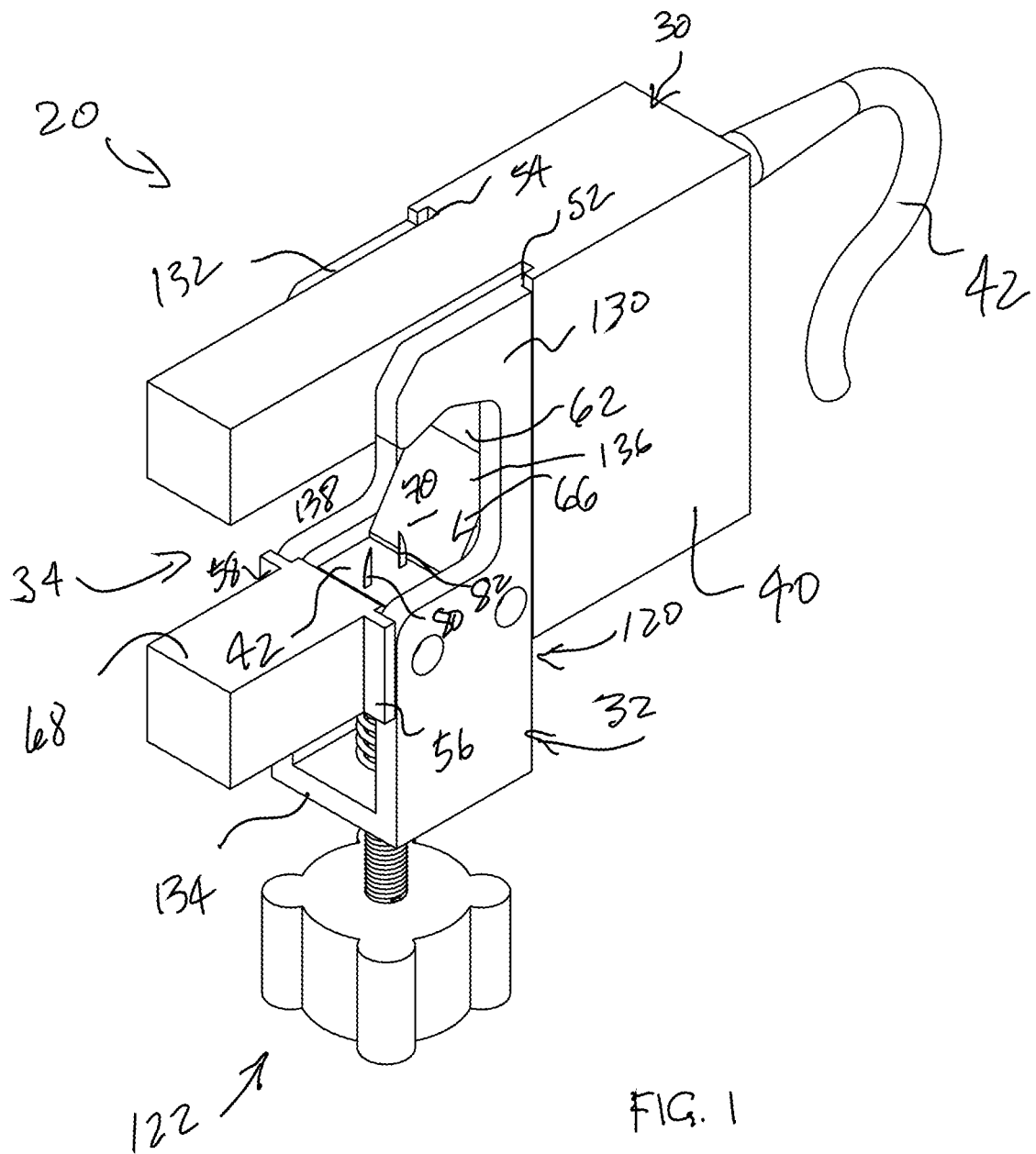
FIG. 1 is perspective view of a first example sensor clamp of the present invention.
Figure 2:
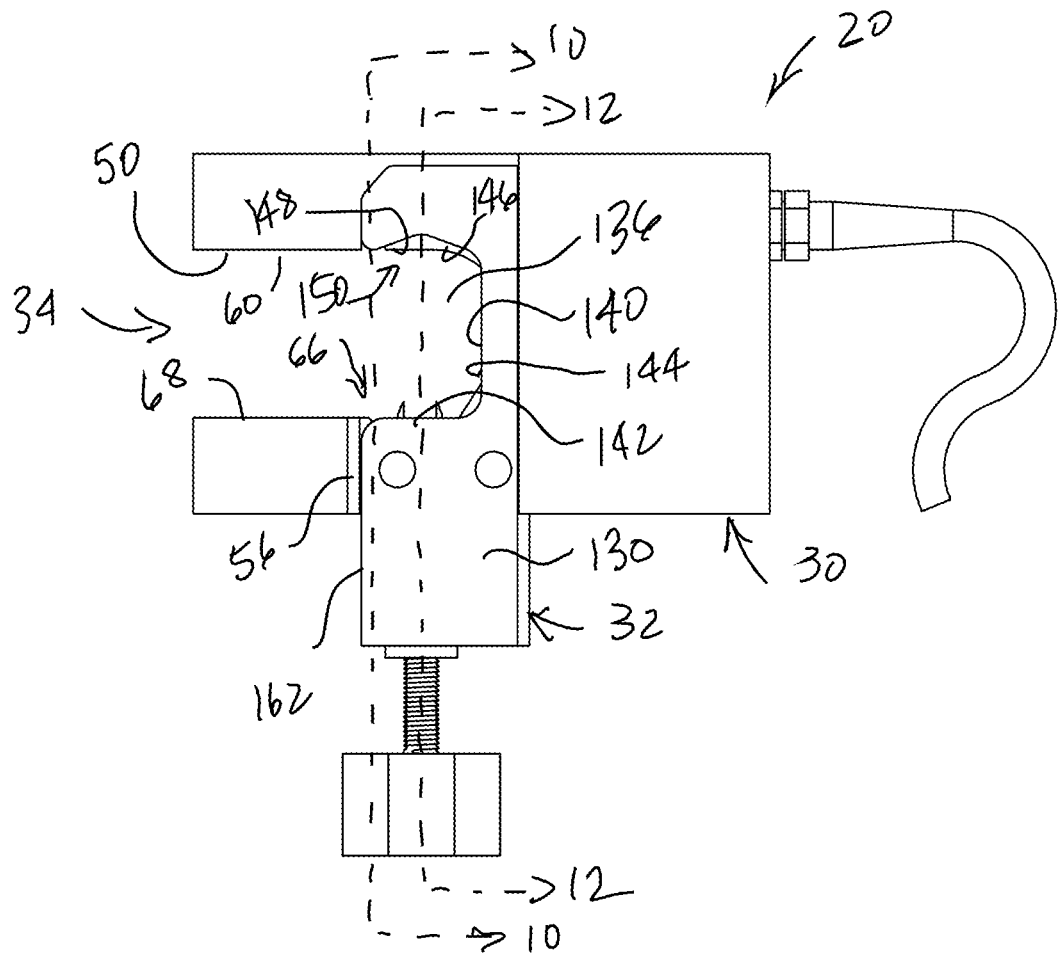
FIG. 2 is a front elevation view illustrating a first example carriage assembly of the first example sensor clamp, with the first example carriage assembly being in an open position.
Figure 3:
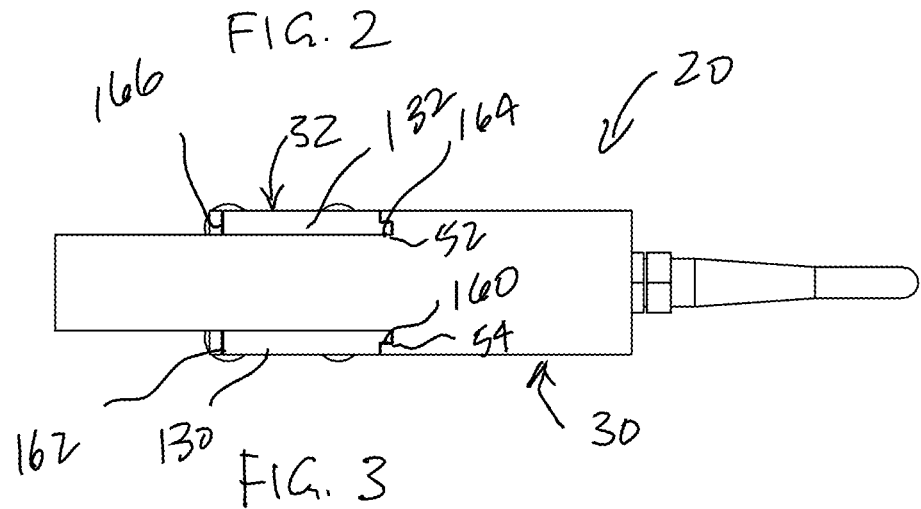
FIG. 3 is a first side view of the first example sensor clamp.
Figure 4:
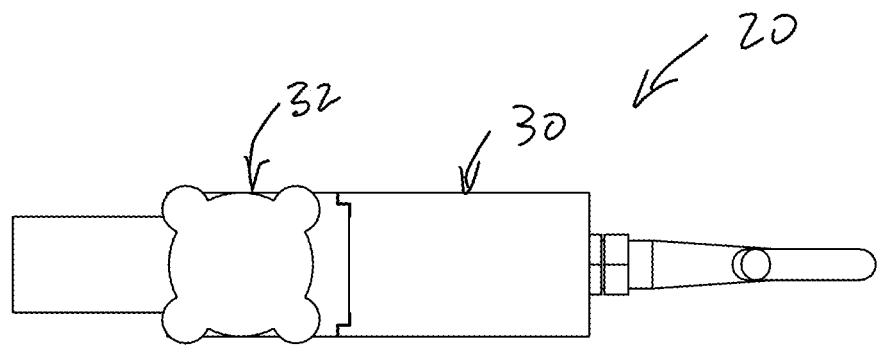
FIG. 4 is a second side view of the first example sensor clamp.
Figures 5, 6:
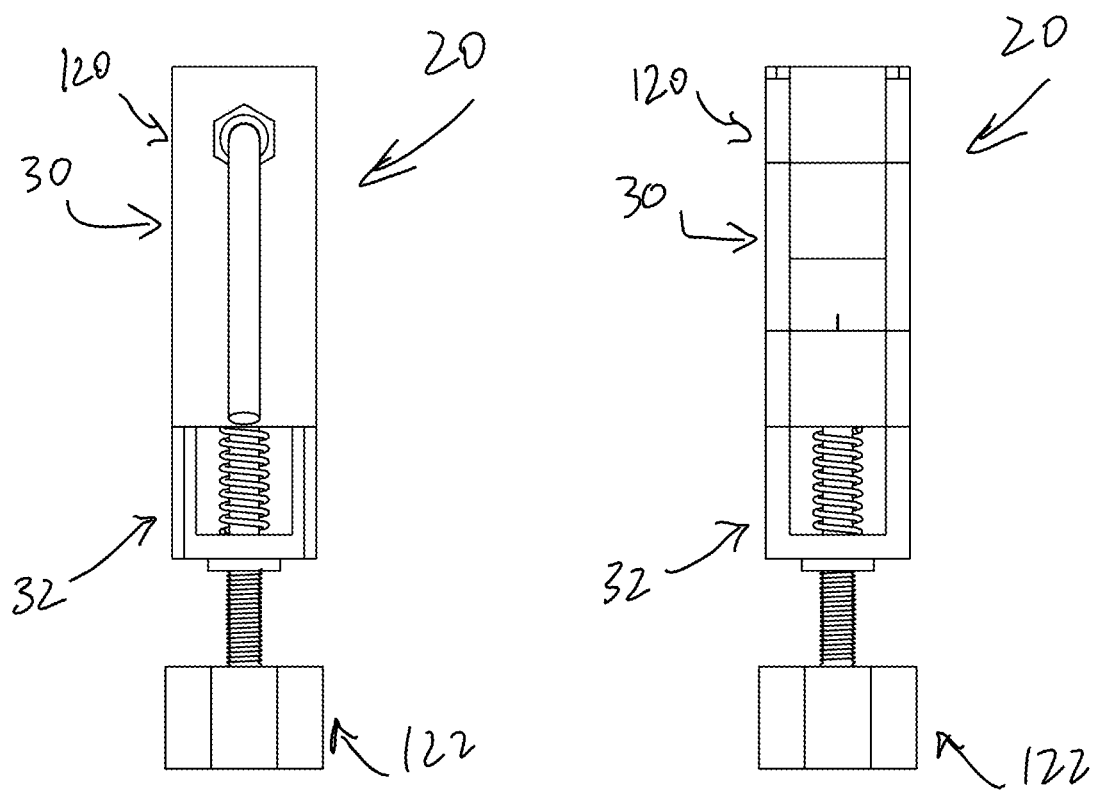
FIG. 5 is a third side view of the first example sensor clamp.
FIG. 6 is a fourth side view of the first example sensor clamp.
Figure 7:
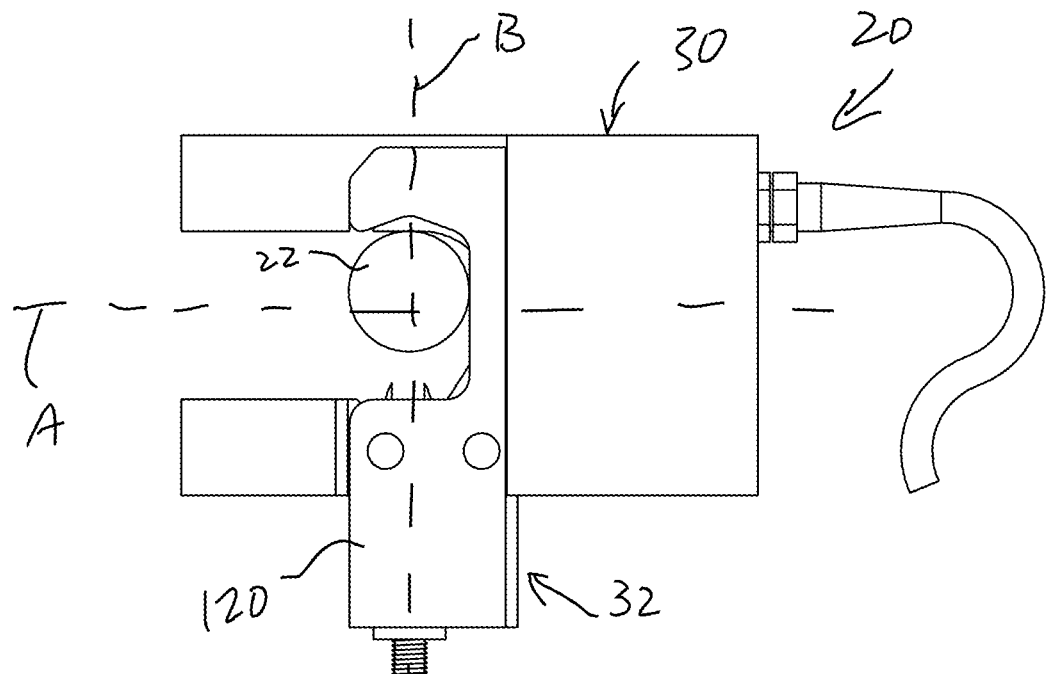
FIG. 7 is a front elevation view illustrating a first step of a process of connecting the first example sensor clamp to a cable, with the first example carriage assembly being in an open position.
Figure 8:
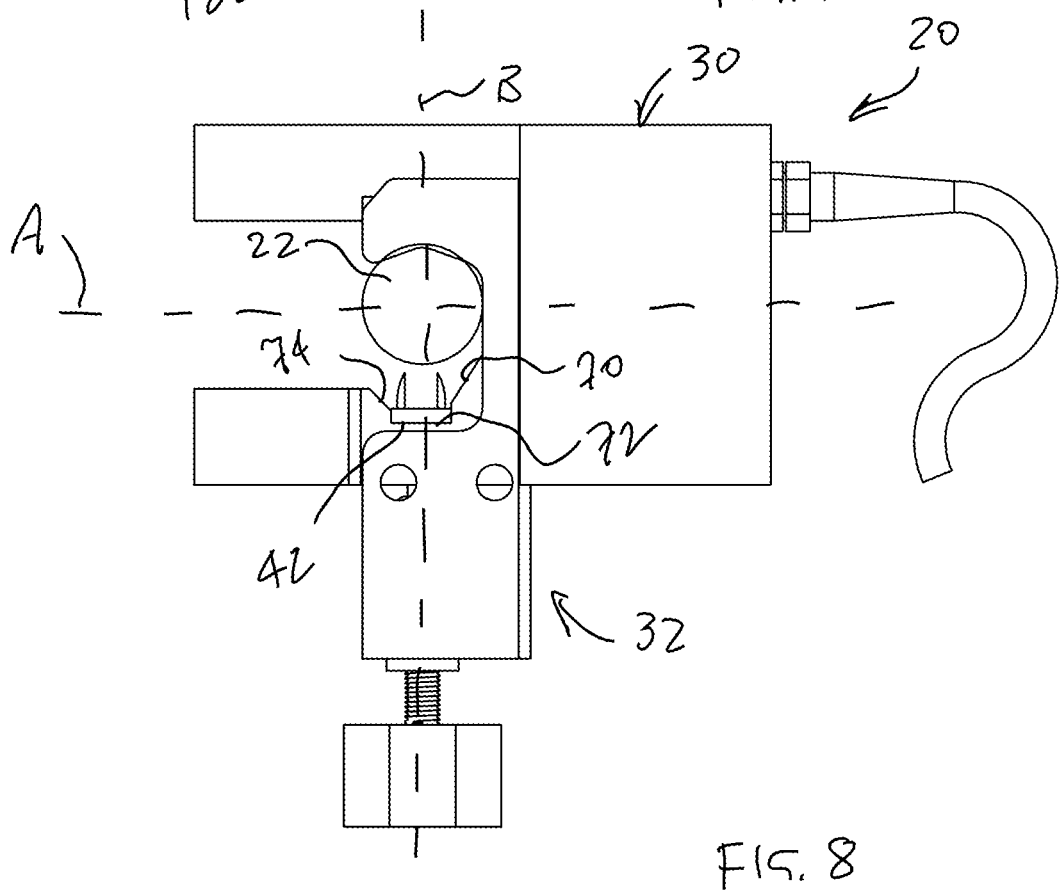
FIG. 8 is a front elevation view illustrating a second step of a process of connecting the first example sensor clamp to a cable, with the first example carriage assembly being in an intermediate position.
Figure 9:
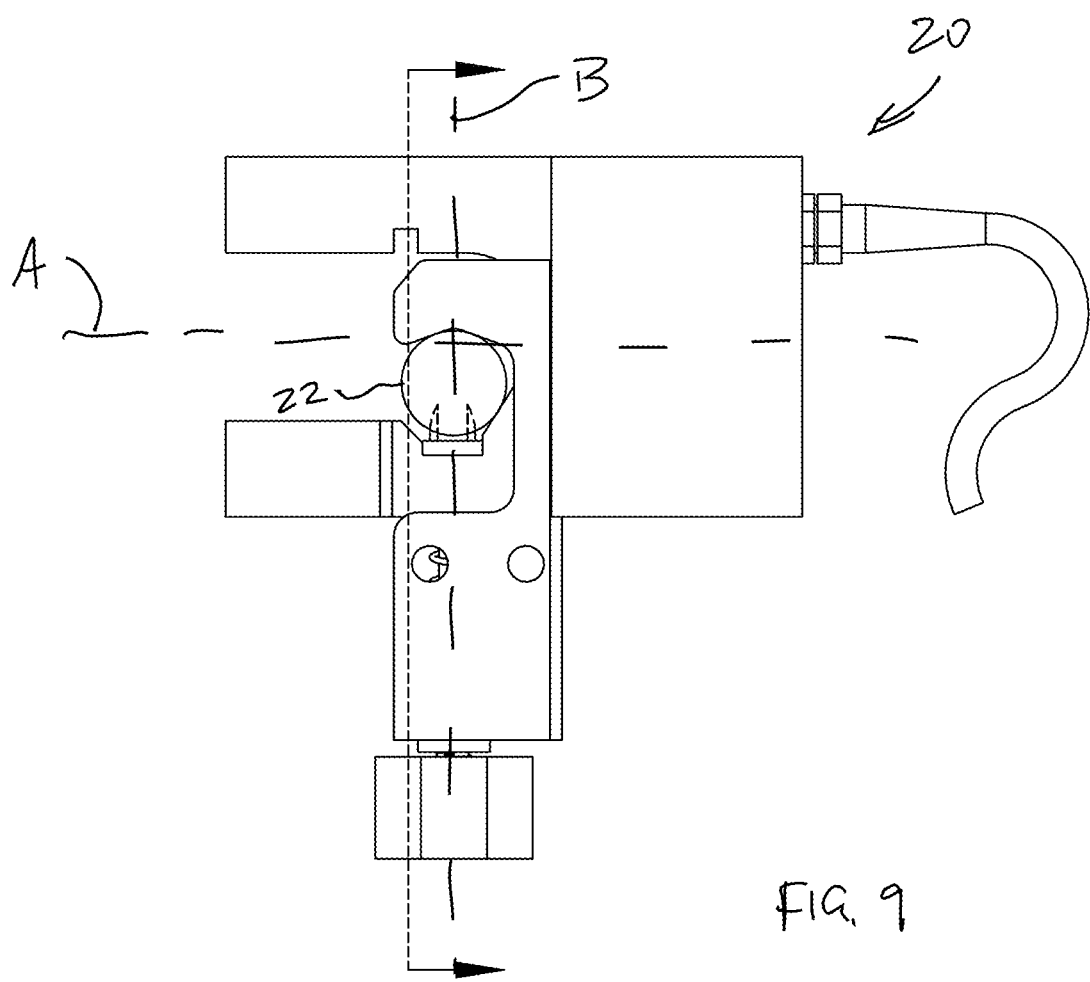
FIG. 9 is a front elevation view illustrating a third step of a process of connecting the first example sensor clamp to a cable, with the first example carriage assembly being in a closed position.
Figures 12, 13:
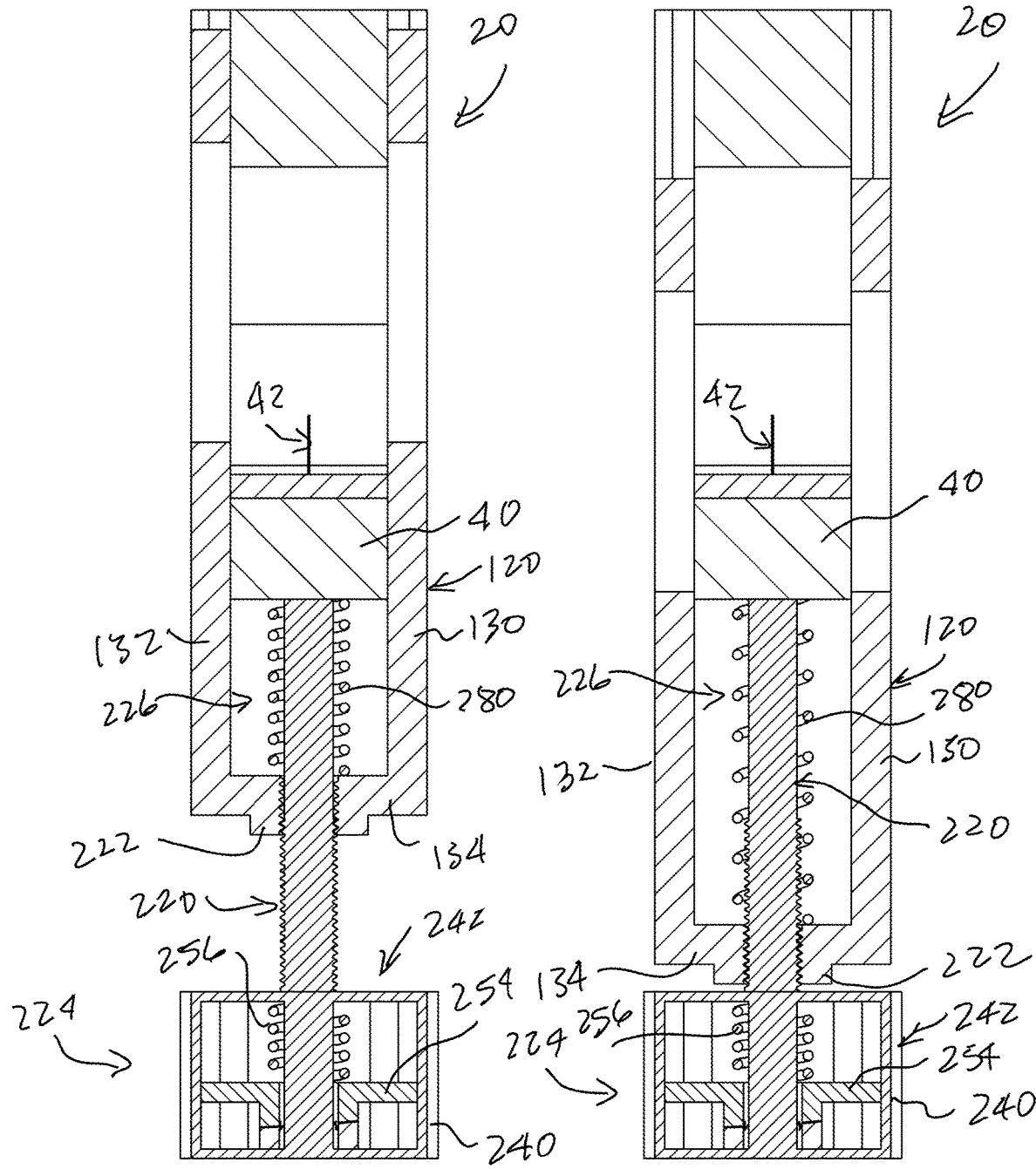
FIG. 12 is section view taken along lines 12-12 in FIG. 2.
FIG. 13 is section view similar to FIG. 12 but depicting the carriage assembly in the closed position.

Referring initially to FIG. 1 of the drawing, depicted therein is a first example cable clamp system 20 constructed in accordance with, and embodying, the principles of the present invention. The example clamp system 20 is configured to clamp onto a cable 22 as shown in FIGS. 7-9 and FIGS. 12 and 13. The example clamp system 20 comprises a base assembly 30 and a carriage assembly 32. The base assembly 30 defines a base notch 34 defining a notch axis A and supports the carriage assembly 32 for movement along a drive axis B relative to the base assembly 30. The drive axis B is substantially or close to perpendicular to the notch axis A.

The carriage assembly 32 may be operated to displace the carriage assembly 32 between an open position and a clamped position relative to the base assembly 30. With the carriage assembly 32 in the open position, the clamp system 20 is in an open configuration. With the clamp system 20 in the open configuration, the clamp system 20 is displaced relative to the cable 22 such that the cable 22 enters the notch 34 along the notch axis A. With the clamp system 20 in the open configuration, the cable 22 is supported relative to the base assembly 30, and the carriage assembly 32 is operated in a first mode such that the carriage assembly 32 is displaced toward the cable 22 and into the clamped position. With the carriage assembly in the clamped position, the clamp system 20 is in a clamped configuration in which the clamp system 20 is clamped onto the cable 22. At this point, operation of the carriage assembly 32 in a second mode displaces the carriage assembly 32 back along the drive axis B towards the open position and places the clamp system 20 back into the open configuration to allow the clamp system 20 to be displaced relative to the cable 22 to remove the clamp system 20 from the cable 22.

Given the foregoing general understanding of the construction and operation of the example clamp system 20, the details of the construction and example clamp system 20 will now be described in detail.

The example base assembly 30 comprises a base housing 40 and a probe member 42. The example base housing 40 contains a sensor electronics system (not shown) that physically engages and/or is wirelessly connected to the cable 22 to allow sensing of characteristics associated with the cable 22 such as current and/or voltage. The example probe member 42 forms a part of the sensor electronics system. The probe member 42 is or may be conventional and will be described herein only to that extent helpful for a complete understanding of the present invention. The sensor electronics system further comprises a communications wiring 44 and/or other communications means (e.g., wireless) to facilitate transmission of sensor signals from the sensor electronics system to remote test equipment (not shown) for processing and/or recording of the sensor signals. The sensor electronics system and remote test equipment are or may be conventional and are not per se part of the present invention. The remote test equipment will not be described herein, and the sensor electronics system will be described herein only to that extent helpful to a complete understanding of the principles of the present invention.

The exact configuration of the base housing 40 is not critical. The base housing 40 defines the base notch 34 defining the notch axis A and supports the carriage assembly 32 for movement along the drive axis B relative to the base notch 34 as generally described herein. The example base housing 40 defines a notch surface 50, first and second guide slots 52 and 54, and first and second guide walls 56 and 58. The example notch surface 50 defines the base notch 34, while the example guide slots 52 and 54 and the guide walls 56 and 58 engage the carriage assembly 32 to form a guide system that guides the carriage assembly 32 within a limited range of movement along the drive axis B. Other guide systems capable of guiding the carriage assembly 32 along the drive axis B may be used in addition or instead of the example guide system formed by the guide slots 52 and 54 and guide walls 54 and 56.

The example notch surface 50 defines a first notch surface portion 60, a second notch surface portion 62, a third notch surface portion 64, a probe seat surface portion 66, and a fourth notch surface portion 68. The first and second notch surface portions 62 are configured to engage the cable 22 such that the cable 22 may at least partly support the first example cable clamp system 20 when the clamp system 20 is in the open configuration as will be described in detail below. The example probe seat surface portion 66 comprises a first cable guide portion 70, a probe support portion 72, and a second cable guide portion 74. In the example base housing 40, a relief notch 76 is formed in the first notch surface portion 60 as will be described in further detail below.

The probe member 42 comprises first and second probe projections 80 and 82 (FIGS. 1 and 8) and is supported by the probe support portion 72 of the probe seat surface portion 66 such that the probe projections 80 and 82 extend into the base notch 34 adjacent to the third notch surface portion 64. The example drive axis B extends substantially through at least a portion of the probe member 42, and the first and second cable guide portions 70 and 74 are arranged on opposite sides of the drive axis B with reference to the notch axis A. In particular, the example probe member 42 is supported by the base housing 40 such that the probe projections 80 and 82 are substantially symmetrically arranged on opposite sides of the example drive axis B adjacent to and between the first and second cable guide portions 70 and 74, respectively.

The first and second notch surface portions 60 and 62 are arranged on a first side of the notch axis A, while the probe seat surface portion 66 and fourth notch surface portion 68 are arranged on a second side of the notch axis A. The third notch surface portion 64 extends between the second notch surface portion 62 and the probe seat surface portion 66, and the notch axis A extends through the third notch surface portion 64. The probe member 42 is secured to the probe seat portion 54 such that the probe member 42 is supported by the base housing 40 on the second side of the notch axis A. The example guide slots 52 and 54 are substantially parallel to and arranged on a first side of a reference plane extending through the drive axis B and perpendicular to the notch axis A, and the example guide walls 56 and 58 are spaced from the guide slots 52 and 54 and arranged on a second side of the reference plane.

The example carriage assembly 32 comprises a carriage housing 120 and a carriage drive system 122. The carriage drive system 122 is operable to drive the carriage housing 120 relative to the base housing 40 within a limited range of movement in at least one direction along the drive axis B. The example carriage drive system 122 is capable of driving the carriage housing 120 relative to the base housing 40 in both directions along the drive axis B.

The exact configuration of the carriage housing 120 is not critical, but the carriage housing 120 is configured to be supported by the base housing 40 the carriage assembly 32 for movement along the drive axis B relative to the base notch 34 as generally described herein. The example carriage housing 120 defines at least first, second, and third carriage walls 130, 132 and 134. The first and second carriage walls 130 and 132 are substantially parallel to each other and define first and second carriage cut-outs 136 and 138, respectively. The third carriage wall 134 extends between and rigidly supports the first and second carriage walls 130 and 132 such that the first and second carriage walls 130 and 132 are substantially parallel to each other.

The example carriage cut-outs 136 and 138 need not be the same but are identical in the example carriage housing 120, so only the example first carriage cut-out 136 will be described herein. The example carriage cut-out 136 is defined by a cut-out surface 140 of the first carriage wall 130. The example cut-out surface 140 defines a first cut-out surface portion 142, a second cut-out surface portion 144, a third cut-out surface portion 146, and a fourth cut-out surface portion 148. The third and fourth cut-out surface portions 146 and 148 define a cut-out notched 150 that is sized and dimensioned to receive at least a portion of the cable 22 when the example clamp system 20 is secured to the cable 22 as described herein.

The example surface first carriage wall 130 defines a first guide projection 160 and a first guide surface 162, and the example second carriage wall 132 defines a second guide projection 160 and a second guide surface 162. The guide projections 160 and 164 interact with the guide slots 52 and 54 and guide surfaces 162 and 166 interact with the guide walls 56 and 58 to form the guide system as generally described above. In particular, the first and second guide projections 160 and 164 are sized, dimensioned, and spaced relative to each other to be received by the first and second guide slots 52 and 54 defined by the base housing 40. The first and second guide surfaces 162 and 166 are sized, dimensioned, and spaced relative to each other to engage the first and second guide walls 56 and 58, respectively, when the guide projections 160 and 164 are received by the first and second guide slots 52 and 54. The guide system formed by the guide slots 52 and 54, guide walls 56 and 58, guide projections 160 and 164, and guide surfaces 162 and 166 allow movement of the carriage assembly 32 to a range of movement of the carriage assembly 32 relative to the base assembly 30 along at least a portion of the drive axis B. Again, any structure capable of guiding the movement of the carriage assembly 32 and the base assembly 30 relative to each other along the drive axis B may be used as the guide system of the first example cable clamp system 20.

The example carriage drive system 122 comprises a drive rod 220, a drive collar 222, a drive handle assembly 224, and a return system 226. The example drive rod 220 defines a threaded portion 230 and a non-threaded portion 232. The drive collar 222 is internally threaded to receive the threaded portion 230 of the drive rod 220 and supported by the third carriage wall 134 of the carriage housing 120 such that: the drive rod 220 is substantially aligned with the drive axis B; and axial rotation of the drive rod 220 in first and second rotational directions displaces the drive rod 220 in first and second linear directions, respectively, along the drive axis B.

The example drive handle assembly 224 comprises a handle housing 240 and a torque limiting system 242 comprising a first torque limiting member 250, a second torque limiting member 252, a torque limiter plate 254, and a torque limiter biasing member 256. The exact size, dimensions, and shape of the handle housing 240 are not critical but should allow rotation of the handle housing 240 about the drive axis B as described herein.

The first torque limiting member 250 is secured to the handle housing 240, while the second torque limiting member 252 is secured to the torque limiter plate 254. The torque limiter plate 254 is secured to the drive rod 220 and is rotatably supported within the handle housing 240 such that the drive rod 220 and the handle housing 240 are capable of rotation relative to each other about the drive axis B as shown in FIGS. 10-13. The torque limiter biasing member 256 is arranged to apply a biasing force on handle housing 240 and the torque limiting plate 254 that forces the second torque limiting member 252 against the first torque limiting member 250. The example torque limiter biasing member 256 is a compression spring, but any structure capable of performing the function of the torque limiter biasing member 256 as described herein may be used.

The first torque limiting member 250 defines a set of first torque limiting teeth 260, and the second torque limiting member 252 defines a set of second torque limiting teeth 262. The first torque limiting teeth 260 each define angle surfaces 270 that are angled with respect to the drive axis B and parallel surfaces 272 that substantially parallel to the drive axis B. Similarly, second torque limiting teeth 262 each define angle surfaces 274 that are angled with respect to the drive axis B and parallel surfaces 276 that substantially parallel to the drive axis B. The torque limiter plate 254 is secured to the drive rod 220 and is rotatably supported within the handle housing 240 such that the first and second torque limiting members 242 and 244, and the first and second torque limiting teeth 260 and 262 supported thereby, are maintained in alignment along the drive axis B as shown in FIGS. 10-13.

The biasing force applied by the applied by the torque limiting biasing member 256 causes the angled surfaces 270 and 274 of the torque limiting teeth 260 and 262 engage each other such that axial rotation of the handle housing 240 in a first rotational direction about the drive axis B causes axial rotation of the drive rod 220 in the first rotational direction about the drive axis B so long as resistance on the drive rod 32 is below a predetermined torque limit. The parallel surfaces 272 and 276 of the torque limiting teeth 260 and 262 engage each other such that axial rotation of the handle housing 240 in a second rotational direction about the drive axis B causes axial rotation of the drive rod 220 in the second rotational direction about the drive axis B.

The return system 226 comprises a return biasing member 280 and the arrangement of threaded and non-threaded portions 230 and 232 of the drive rod 220. The example return biasing member 280 is a compression spring, but any structure capable of performing the function of the return biasing member 280 as described herein may be used.

To use the carriage drive system 122, the handle housing 240 is axially rotated in the first direction, and this axial rotation is transferred to the drive rod 220 by the angled surfaces 272 and 276 when resistance on the drive rod 220 is below the predetermined torque limit. Axial rotation of the handle housing 240 in the second direction will always be transferred to the drive rod 220 by the parallel surfaces 270 and 272.

Rotation of the handle housing 240 in the first rotational direction about the drive axis B thus results in displacement of the drive rod 220 in a first linear direction along the drive axis B under certain conditions. In particular, displacement of the drive rod 220 in the first linear direction along the drive axis B displaces the base assembly 30 and the carriage assembly 32 relative to each other such that the probe member 42 moves from the open position into the base notch 34 and eventually into the closed position. The closed position is defined by the geometry of the base notch 34 and the cut-out surface 140 defined by the carriage walls 130 and 132 and the diameter of the cable 22. When the carriage assembly 32 approaches the closed position, resistance to continued displacement of the drive rod 220 in the first linear direction increases. At some point, resistance to continued displacement of the drive rod 220 in the first linear direction exceeds the predetermined torque limit defined by the torque limiter system 242, and the angled surfaces 272 and 276 slip relative to each other. At this point, the carriage assembly 32 is in the closed position and torque is no longer transferred between the handle housing 240 and the drive rod 220.

When the first example cable clamp system 20 is clamped onto the cable 22, the probe projections 80 and 82 of the probe member 42 extend at least partly into the cable 22. The sensor electronics system and remote testing equipment may thus be used to measure characteristics associated with the cable.

To remove the first example cable clamp system 20 from the cable 22, the handle housing 240 is rotated in the second rotational direction about the drive axis B. The parallel surfaces 272 and 276 transfer rotation of the handle housing 240 to the drive rod 220, causing displacement of the drive rod 220 in the second linear direction along the drive axis B. The drive rod 220 forces the carriage assembly 32 from the closed position to the open position relative to the base assembly 30. When the carriage assembly 32 reaches the open position, the threaded portion 230 of the drive rod 220 disengages from the drive collar 222 and the non-threaded portion 232 is within the drive collar 222. Continued axial rotation of the drive rod 220 in the second direction about the drive axis B no longer results in movement of the drive rod 220 in the second linear direction along the drive axis B.

With the carriage assembly 32 in the open position, however, the return biasing member 280 continues to bias the carriage housing 120 and the drive collar 222 supported thereby towards the threaded portion 230 of the drive rod 220. Therefore, if the handle housing 240 is again rotated in the first rotational direction about the drive axis B, the threaded portion 230 will engage the internal threading of the drive collar 222 to allow displacement of the carriage assembly 32 from the open position to the closed position relative to the base assembly 30.

The combination of the drive rod 220, drive collar 222, and return system 226 as described above thus prevents the carriage drive system 122 from completely removing the carriage assembly 32 from the base assembly 30 using the drive handle assembly 224. The torque limiting system 242 prevents the drive carriage system 122 from being over tightened in a manner that could cause damage to either the first example cable clamp system 20 or the cable 22.

Figure 14:
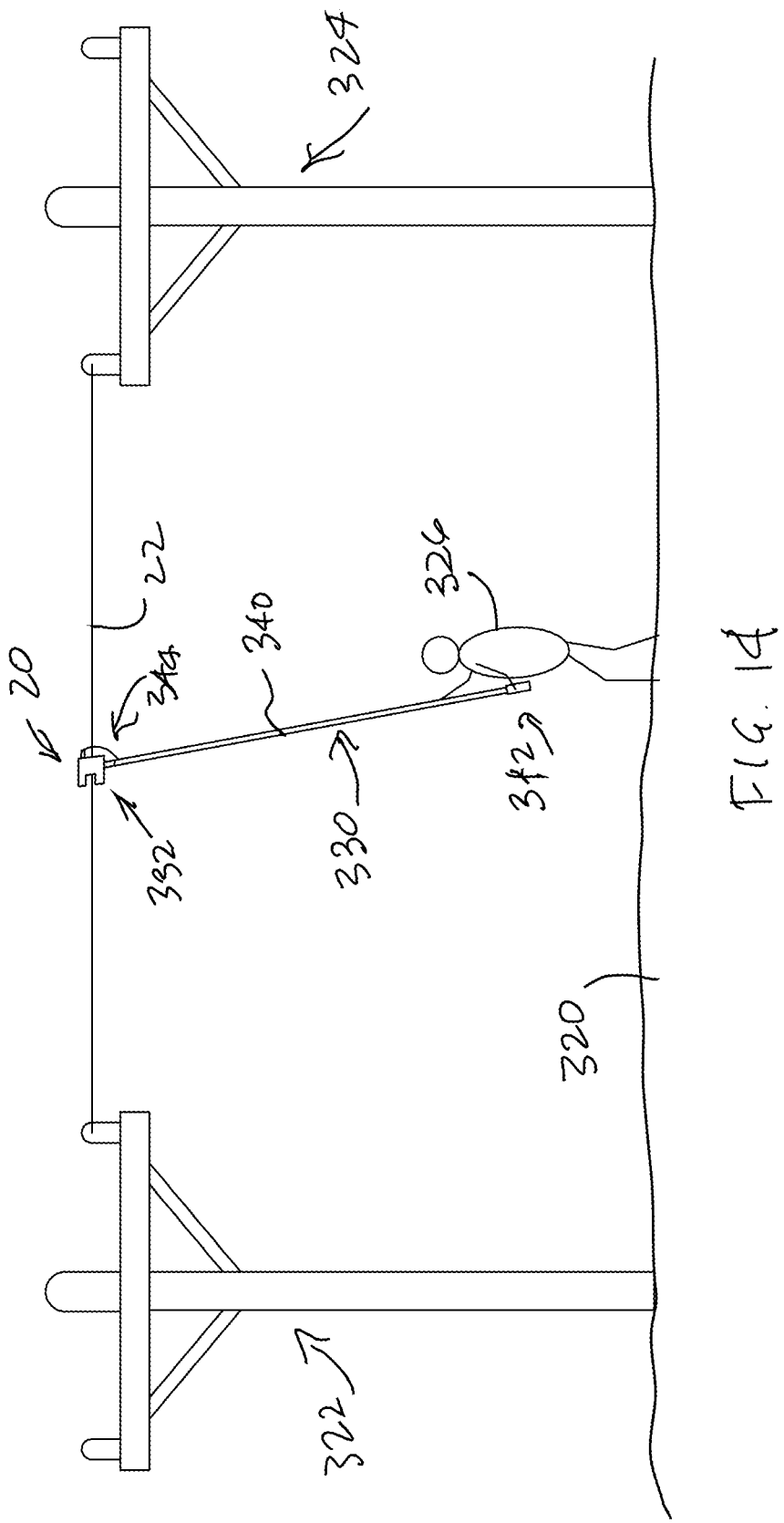
FIG. 14 is a schematic environmental view illustrating one example method of attaching of the first example sensor clamp to a cable.

Turning now to FIG. 14 of the drawing, an example method of use of the first example cable clamp system 20 will now be described. FIG. 14 illustrates that the example cable 22 is suspended above the ground 320 by first and second support assemblies 322 and 324. FIG. 14 further illustrates that the first example cable clamp system 20 is being arranged on the example cable 22 by a user 326. As is conventional, the example cable 22 is suspended by the support assemblies 322 and 324 at a height above the ground 320 well beyond the reach of the user 326.

In particular, the user 326 uses a pole system 330 and an actuator system to clamp the first example cable clamp system 20 onto the example cable 22. The actuator system 332 is supported by the pole system 330 such that the actuator system 332 can be operated to rotate the handle housing 240 in either direction about the drive axis B. Further, the actuator system 332 is configured to be operated remotely, so the operator on the ground can operate the first example cable clamp system 20.

The example pole system 320 comprises a pole assembly 340 defining a proximal end 342 and a distal end 344 and is sized and dimensioned to allow the user 326 standing on the ground 320 and grasping the pole system 340 from the proximal end 342 to reach the cable 22 with the distal end 344.

Figure 15:
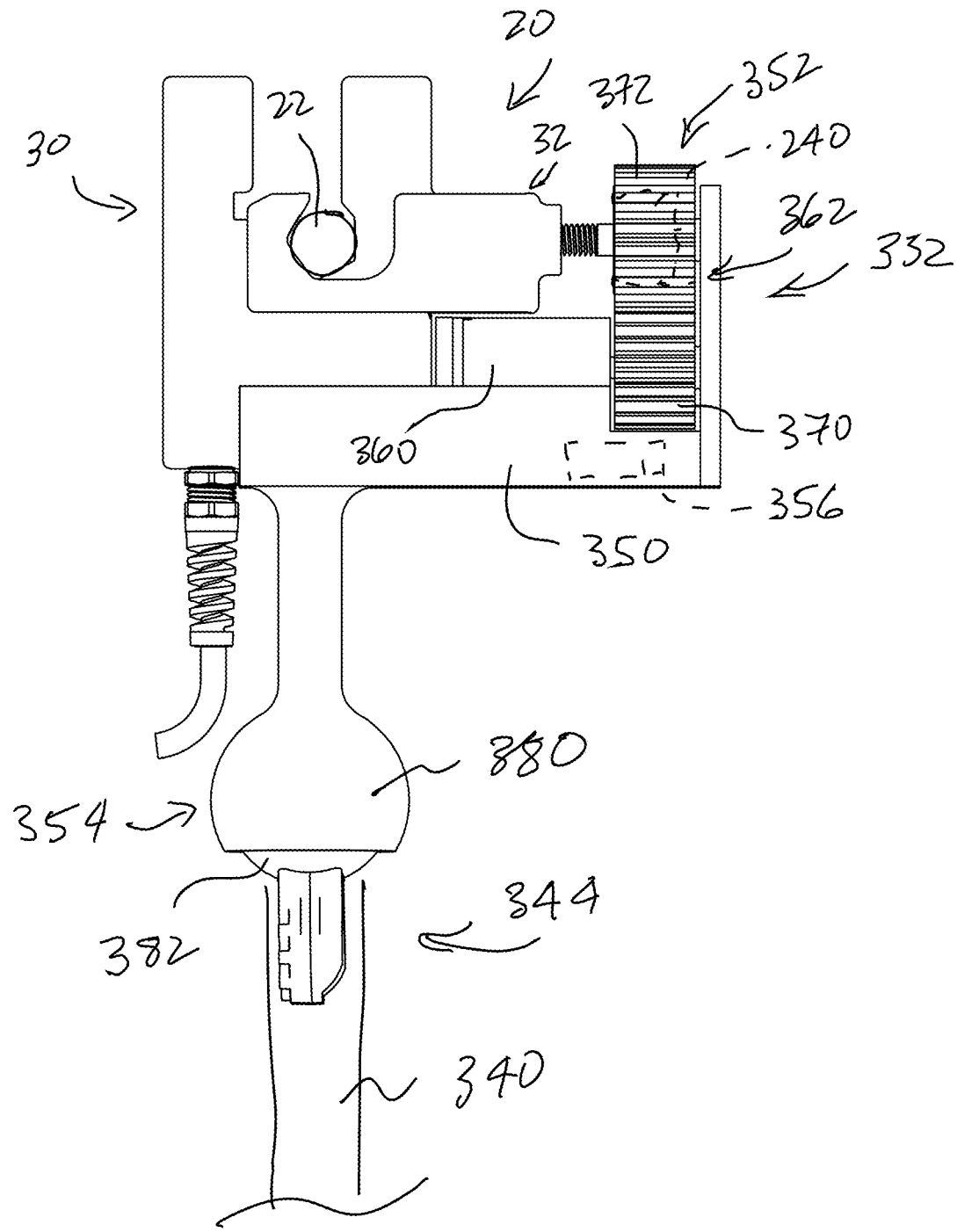
FIG. 15 is a somewhat schematic front elevation view illustrating one example pole support system that may be used as part of the method depicted in FIG. 14.

As perhaps best shown in FIG. 15, the actuator system 332 is supported by the distal end 344 of the pole system 340 and in turn supports the first example cable clamp system 20. FIG. 15 further illustrates that the actuator system 332 comprises an actuator housing 350, an actuator assembly 352, an angle adjustment assembly 354, and a control system 356. The actuator housing 350 is configured to engage and support at least a portion of the base assembly 30 of the first example cable clamp system 20.

The example actuator assembly 352 comprises an actuator motor 360 and a transmission system 362. The control system 356 is or may be conventional and allows the user 326 to operate the actuator motor 360 wirelessly. The transmission system 362 defines a first transmission member 370 and a second transmission member 372. The first transmission member 370 is mounted on a shaft (not shown) of the actuator motor 360, and the actuator housing 350 supports the second transmission member 372 to engage the first transmission member 370. The second transmission member 372 is further configured to engage the handle housing 240. Operation of the motor 360 rotates the first transmission member 370. The first transmission member 370 engages the second transmission member 372 such that rotation of the first transmission member 370 causes rotation of the second transmission member 372. The second transmission member 372 engages the handle housing 240 such that rotation of the second transmission member 372 causes rotation of the handle member 240. Remote operation of the actuator motor 360 using the control system 256 may thus allow reconfiguration, by a user 326 on the ground 320, of the first example cable clamp system 20 between its open and closed configurations as generally described above.

The example angle adjustment assembly 354 comprises a socket 380 supported by the actuator housing 350 and a ball 382 supported by the pole assembly 340. The socket 380 engages the ball 382 to support the notch axis A and drive axis B in a desired orientation relative to the cable 22 during use of the pole system 330 and actuator system 332 to mount the first example cable clamp system 20 onto the cable 22.

What is claimed is:

1. A cable clamp system comprising:
   a base assembly defining a base notch defining a notch axis;
   a carriage assembly defining a drive axis; a drive system for displacing the carriage assembly along the drive axis; and
   a torque limiter for disengaging the drive system from the carriage assembly when the carriage assembly is in a closed position relative to the base assembly; whereby
   the drive axis is substantially orthogonal to the notch axis.

2. A cable clamp system as recited in claim 1, further comprising a return system for engaging the drive system with the carriage assembly when the carriage assembly is in an open position relative to the base assembly.

3. A cable clamp system as recited in claim 1, further comprising a guide system for guiding the carriage assembly for movement along the drive axis relative to the base assembly.

4. A cable clamp system as recited in claim 1, further comprising an actuator system comprising:
   an actuator assembly; and
   an actuator housing adapted to support the actuator assembly and the base assembly such that
   the actuator assembly engages the drive system; and
   operation of the actuator assembly operates the drive system to displace the carriage assembly along the drive axis.

5. A cable clamp system as recited in claim 4, further comprising a pole system adapted to support the base assembly.

6. A cable clamp system comprising:
   a base assembly defining a base notch defining a notch axis;
   a carriage assembly defining a drive axis;
   a guide system for guiding the carriage assembly for movement along the drive axis; and
   a drive system for displacing the carriage assembly along the drive axis between an open position and a closed position, the drive system comprising a drive rod; and
   a drive collar supported by the base assembly; whereby
   the drive rod threadingly engages the drive collar such that axial rotation of the drive rod causes linear displacement of the carriage assembly relative to the base assembly; whereby
   the drive axis is substantially orthogonal to the notch axis.

7. A cable clamp system as recited in claim 6, in which the drive system further comprises a torque limiting system for limiting the application of rotational torque to the drive rod when the carriage assembly is in the closed position.

8. A cable clamp system as recited in claim 7, in which the torque limiting system comprises:
   a handle housing;
   a torque limiting plate secured to the drive rod;
   a first torque limiting member supported by the handle housing;

a second torque limiting member supported by the torque limiting plate; and a torque limiting biasing member for applying a biasing force that forces the first and second torque limiting members towards each other.

9. A cable clamp system as recited in claim 6, in which the drive rod defines a threaded portion and a non-threaded portion, where the threaded portion disengages from the drive collar to prevent axial rotation of the drive rod from causing linear displacement of the carriage assembly relative to the base assembly when the carriage assembly is in the open position.

10. A cable clamp assembly as recited in claim 9, further comprising a return biasing member for applying a return biasing the drive collar to reengage the drive collar with the threaded portion of the drive rod to allow axial rotation of the drive rod to cause linear displacement of the carriage assembly relative to the base assembly from the open position to the closed position.

11. A cable clamp system as recited in claim 6, further comprising an actuator system comprising:
an actuator assembly; and
an actuator housing adapted to support the actuator assembly and the base assembly such that
the actuator assembly engages the drive system; and
operation of the actuator assembly operates the drive system to displace the carriage assembly along the drive axis.

12. A cable clamp system as recited in claim 11, further comprising a pole system adapted to support the base assembly.

13. A method of engaging a cable clamp system with a cable comprising the steps of:
providing a base assembly defining a base notch defining a notch axis;
supporting a carriage assembly relative to the base assembly such that the carriage assembly moves relative to the base assembly along a drive axis, where the drive axis is substantially orthogonal to the notch axis; and
with the carriage assembly in an open position relative to the base assembly, arranging the cable within the base notch;
with the cable arranged within the base notch, displacing the carriage assembly along the drive axis from the open position and a closed position; and
limiting the application of rotational torque to the drive rod when the carriage assembly is in the closed position.

14. A method as recited in claim 13, in which the step of displacing the carriage assembly along the drive axis comprises the steps of:
supporting a drive collar with the base assembly;
threadingly engaging a drive rod with the drive collar such that axial rotation of the drive rod causes linear displacement of the carriage assembly relative to the base assembly; and
axially rotating the drive rod.

15. A method as recited in claim 13, in which the drive rod defines a threaded portion and a non-threaded portion, further comprising the step of disengaging the threaded portion from the drive collar to prevent axial rotation of the drive rod from causing linear displacement of the carriage assembly relative to the base assembly when the carriage assembly is in the open position.

16. A cable clamp system comprising:
a base assembly defining a base notch defining a notch axis;
a carriage assembly defining a drive axis;
a drive system for displacing the carriage assembly along the drive axis; and
an actuator system comprising:
an actuator assembly; and
an actuator housing adapted to support the actuator assembly and the base assembly such that
the actuator assembly engages the drive system; and
operation of the actuator assembly operates the drive system to displace the carriage assembly along the drive axis.

17. A cable clamp system as recited in claim 16, further comprising a pole system adapted to support the base assembly.

18. A method of engaging a cable clamp system with a cable comprising the steps of:
providing a base assembly defining a base notch defining a notch axis;
supporting a carriage assembly relative to the base assembly such that the carriage assembly moves relative to the base assembly along a drive axis;
with the carriage assembly in an open position relative to the base assembly, arranging the cable within the base notch; and
with the cable arranged within the base notch, displacing the carriage assembly along the drive axis from the open position and a closed position; wherein
the step of displacing the carriage assembly along the drive axis comprises the steps of
supporting a drive collar with the base assembly;
threadingly engaging a drive rod with the drive collar such that axial rotation of the drive rod causes linear displacement of the carriage assembly relative to the base assembly; and
axially rotating the drive rod.

* * * * *